(12) United States Patent
Wang

(10) Patent No.: US 6,856,027 B2
(45) Date of Patent: Feb. 15, 2005

(54) MULTI-CHIPS STACKED PACKAGE

(75) Inventor: Meng-Jen Wang, Pingtung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

(21) Appl. No.: 10/820,826

(22) Filed: Apr. 9, 2004

(65) Prior Publication Data

US 2004/0212068 A1 Oct. 28, 2004

(30) Foreign Application Priority Data

Apr. 25, 2003 (TW) .......................... 92109655 A

(51) Int. Cl.$^7$ .......................... H01L 23/48; H01L 23/02
(52) U.S. Cl. .................. 257/777; 257/686; 257/778; 257/784
(58) Field of Search ................. 257/777–781, 257/784, 786, 666, 670, 672, 673, 676, 685, 686, 692, 723; 438/107–110, 117, 123, 613, 617

(56) References Cited

U.S. PATENT DOCUMENTS

| 6,507,098 B1 | * | 1/2003 | Lo et al. ................. 257/686 |
| 6,507,107 B2 | * | 1/2003 | Vaiyapuri ................. 257/723 |
| 6,740,973 B1 | * | 5/2004 | Hsin ...................... 257/749 |

* cited by examiner

Primary Examiner—Hung Vu
(74) Attorney, Agent, or Firm—Bacon & Thomas PLLC

(57) ABSTRACT

A multi-chips stacked package at least comprises a substrate, an upper chip, a lower chip, a plurality of electrically conductive wires and a plurality of conductive bumps. The upper chip is flip-chip bonded to the upper surface of the substrate; and the lower chip is accommodated in the opening and wire-bonded to the upper chip. Furthermore, the lower chip can be wire-bonded to the substrate via a plurality of another electrically conductive wires, which directly connect the lower chip and the substrate.

14 Claims, 2 Drawing Sheets

MULTI-CHIPS STACKED PACKAGE

BACKGROUND OF THE INVENTION

1. Field of Invention

This invention relates to a multi-chips stacked package. More particularly, the present invention is related to a multi-chips stacked package that utilizes one chip electrically connecting to another chip and a substrate through electrically conductive wires directly connecting to said another chip and said substrate respectively to enhance the density of I/O signals and the degree of freedom for laying out the electrical circuits of the package.

2. Related Art

As we know, in the semiconductor industries, the manufacture of semiconductors mainly comprises the manufacture of wafers and the assembly of integrated circuits devices. Therein, the integrated circuits (ICs) devices are completely formed by the processes of forming integrated circuits devices on the semiconductor wafers, sawing the wafers into individual integrated circuits devices, placing the individual integrated circuits devices on the substrates, electrically connecting the integrated circuits devices to the substrates and encapsulating the integrated circuits devices and substrates to form a plurality of assembly packages. Due to the encapsulation covering the integrated circuits devices, the integrated circuits devices are able to be protected from the damp entering. In addition, the assembly packages may further provide external terminals for connecting to printed circuit board (PCB).

However, recently, integrated circuits packaging technology is becoming a limiting factor for the development in packaging integrated circuits devices of higher performance. Semiconductor package designers are struggling to keep pace with the increase in pin count, size limitations, low profile, and other evolving requirements for packaging and mounting integrated circuits.

Due to the assembly package in miniature and the integrated circuits operation in high frequency, MCM (multi-chips module) packages are commonly used in said assembly packages and electronic devices. Usually, said MCM package mainly comprises at least two chips encapsulated therein in a parallel manner to form a side-by-side package, for example a processor unit, a memory unit and related logic units, so as to upgrade the electrical performance of said assembly package. In addition, the electrical paths between the chips in said MCM package are short so as to reduce the signal delay and save the reading and writing time.

Per the above-mentioned, a multi-chips stacked package is provided, as shown in FIG. 1, as a standard and common design. Referring to FIG. 1, it is characterized that an upper chip 110 is flipped over and disposed above an opening 122 passing through the upper surface 124 and the lower surface 126 of the substrate 120, and electrically connected to the substrate 120 through electrically conductive bumps 150; and a lower chip 130 is accommodated in the opening 122 and electrically connected to the upper chip 110 through electrically conductive bumps 160. Generally speaking, the upper chip 110 and the lower chip 130 are a memory chip and a logic chip respectively. In such a manner, the electrical signals are able to be integrated in the package and then are transmitted to external devices through solder balls 128 attached to the lower surface 126 of the substrate 120. Thus, the size of said multi-chips stacked package is reduced and the transmission path of the electrical signals are shortened. Namely, the signal delay is reduced and the electrical performance of said multi-chips stacked package is upgraded.

As mentioned above and per the conventional invention as shown in FIG. 1, the upper chip 110 is electrically connected to the substrate 120 through electrically conductive bumps 150. However, before the upper chip 110 is bonded to the lower chip 130, there are flip-chip pads and under bump metallization layers formed on the upper chip 110 and the lower chip 130. Accordingly, the manufacturing cost is increased and the process is caused to be more complex. Besides, the electrical signals of the lower chip 130 are transmitted to the substrate 120 through the electrically conductive bumps 150 and 160, and the upper chip 110. Thus, the design of the electrical circuits of the upper chip 110 are usually made in accordance with the lower chip 130 and are taken into more consideration according to the integration of the upper chip 110 and the lower chip 130. Consequently, it lowers the degree of freedom of designing the upper chip 110 and laying out the circuits of the upper chip 110.

Therefore, providing another multi-chips stacked package to solve the mentioned-above disadvantages is the most important task in this invention.

SUMMARY OF THE INVENTION

In view of the above-mentioned problems, an objective of this invention is to provide a multi-chips stacked package for enhancing the degree of freedom of designing the electrical circuits on the chips and lowering the cost for manufacturing the package.

To achieve the above-mentioned objective, a multi-chips stacked package is provided, wherein the multi-chips stacked package mainly comprises a substrate having an opening, an upper chip, a lower chip, a plurality of electrically conductive wires and a plurality of electrically conductive bumps. Therein, the upper chip is flipped over and disposed above the opening, and the active surface of the upper chip is attached to the upper surface of the substrate through the electrically conductive bumps; and the lower chip is accommodated in the opening and electrically connected to the upper chip through the electrically conductive wires. Moreover, the lower chip is further electrically connected to the substrate through another electrically conductive wires directly connecting to the substrate. In such a manner, the electrical signals of the lower chip are transmitted to the substrate not only through the electrically conductive wires connecting to the upper chip and the electrically conductive bumps but also through another electrically conductive wires connecting to the substrate directly. Consequently, it can enhance the degree of freedom of designing the upper chip and laying out the circuits of the upper chip.

In summary, this invention is related to a multi-chips stacked package utilizing the lower chip electrically connecting to the upper chip and the substrate simultaneously for enhancing the density of I/O signals and the degree of freedom for laying out the electrical circuits of the package. Thus, it is unnecessary to form flip-chip pads and under bump metallization layers on said flip-chip pads to simply the manufacturing process.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

The multi-chips stacked package according to the preferred embodiments of this invention will be described herein below with reference to the accompanying drawings, wherein the same reference numbers refer to the same elements.

Figure 1:
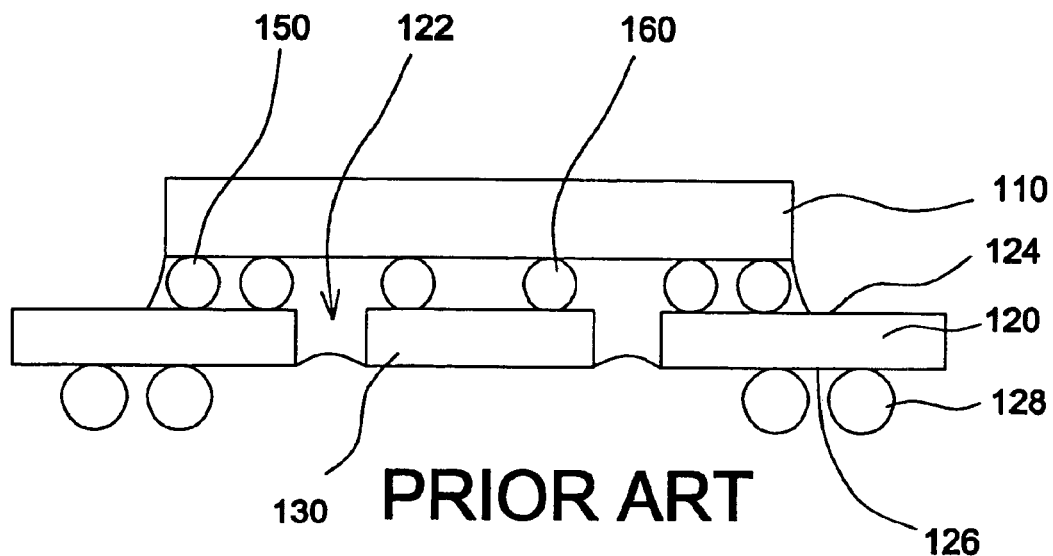
FIG. 1 is a cross-sectional view of the conventional multi-chips stacked package.
Figure 2:
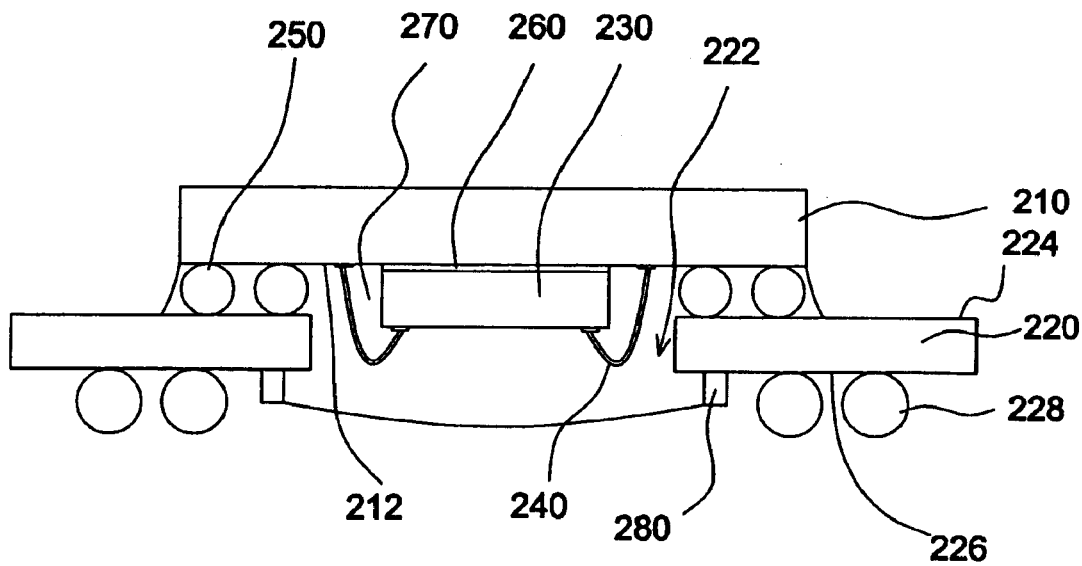
FIG. 2 is a cross-sectional view of a multi-chips stacked package according to the first preferred embodiment.

In accordance with a first preferred embodiment as shown in FIG. 2, there is provided a multi-chips stacked package. Referring to FIG. 2, the multi-chips stacked package mainly comprises an upper chip 210, a substrate 220 having an opening 222, a lower chip 230, a plurality of electrically conductive wires 240, and a plurality of electrically conductive bumps 250. Therein, the upper chip 210 is flipped over and attached on the upper surface 224 of the substrate 220 via electrically conductive bumps 250 so as to cover an opening 222 of the substrate 220. Besides, the lower chip 230 is accommodated in the opening 222 and attached to the active surface 212 of the upper chip 210 via an adhesive layer 260, and is electrically connected to the upper chip 210 through said electrically conductive wires 240. Moreover, there is an encapsulation 270, for example an underfill and an epoxy, filled into the opening 222 so as to encapsulate not only the electrically conductive bumps 250 but also the upper chip 210, the lower chip 230 and the electrically conductive wires 240. In such a manner, the encapsulation 270 not only prevents the electrically conductive bumps 250, which connect the substrate 220 and the upper chip 210, from being damaged due to the difference of the coefficient of thermal expansion of the substrate 220 from that of the upper chip 210 but also prevents the damp from entering into the upper chip 210, the lower chip 230 and the electrically conductive wires 240 encapsulated by the encapsulation 270. As mentioned above, the lower chip 230 is electrically connected to the upper chip 210 through the electrically conductive wires 240, so it is unnecessary to form flip-chip pads and under bump metallization layers on the upper chip 210 and the lower chip 230. Thus, the manufacturing process is simplified and the cost is lowered. In addition, there are a plurality of solder balls 280 formed on the lower surface 226 of the substrate 220 to connect the package to external electronic devices.

It should be noted when the quantity of the encapsualtion 270 covering the electrically conductive bumps 250, the upper chip 210, the lower chip 230 and the electrically conductive wires 240 is excessive, it is easy to cause the lower surface 226 of the substrate 220 to be contaminated. Thus, the reliability of the attachment of the solder balls 228 to the substrate 220 is lowered. Accordingly, providing a dam 280 located at the periphery of the opening 222, for example a ring-type epoxy, can avoid said underfill contaminating the lower surface 226 of the substrate 220.

Figure 3:
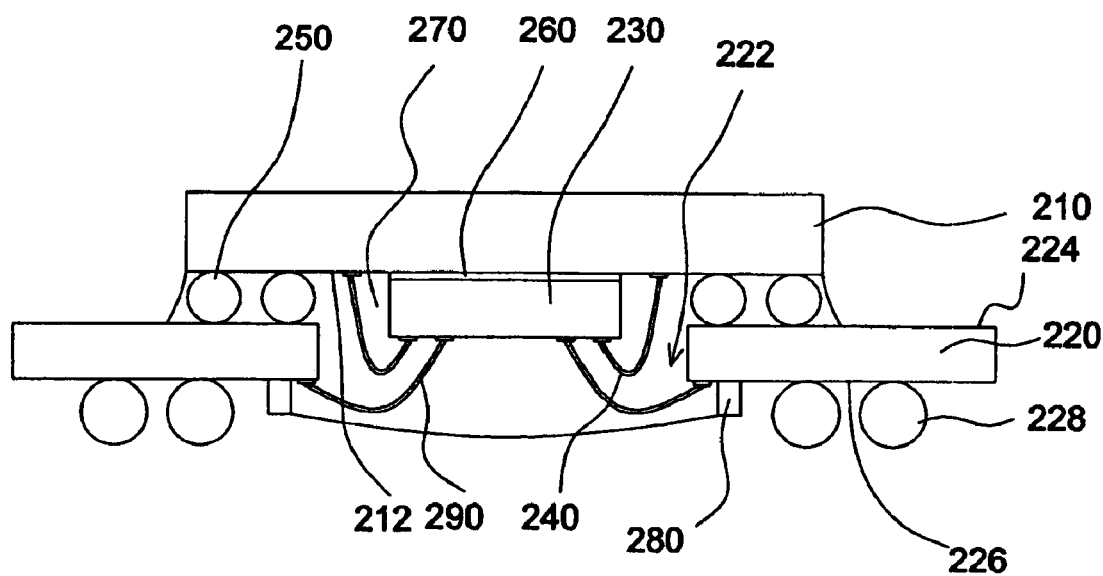
FIG. 3 is a cross-sectional view of a multi-chips stacked package according to the second preferred embodiment.

Next, referring to FIG. 3, which illustrates the second embodiment of this invention. The difference between the second embodiment as shown in FIG. 3 and the first embodiment as shown above is that the lower chip 230 in the second embodiment is further electrically connected to the substrate 220 through another electrically conductive wires 290. Consequently, the electrical signals of the lower chip 230 is not only transmitted to the substrate 220 through the electrically conductive wires 240 connecting to the upper chip 210 and the electrically conductive bumps 250 but also transmitted to the substrate 220 directly by said electrically conductive wires 290. Accordingly, there is higher degree of freedom of designing the electrical circuits of the upper chip 210.

Although the invention has been described in considerable detail with reference to certain preferred embodiments, it will be appreciated and understood that various changes and modifications may be made without departing from the spirit and scope of the invention as defined in the appended claims.

What is claimed is:

1. A multi-chips stacked package, comprising:
    a substrate having an upper surface, a lower surface and an opening passing through the upper surface and the lower surface;
    an upper chip having a first active surface and a first back surface wherein the upper chip is flipped over and attached to the upper surface of the substrate via a plurality of electrically conductive bumps; and
    a lower chip accommodated in the opening, disposed on the first active surface of the upper chip and electrically connected to the first active surface of the upper chip through a plurality of first electrically conductive wires.

2. The multi-chips stacked package of claim 1, further comprising a plurality of second electrically conductive wires connecting the second active surface of the lower chip and the lower surface of the substrate.

3. The multi-chips stacked package of claim 1, further comprising a dam located at the periphery of the opening and on the lower surface of the substrate.

4. The multi-chips stacked package of claim 3, wherein the dam is formed in a ring-like shape.

5. The multi-chips stacked package of claim 3, wherein the dam is made of an epoxy.

6. The multi-chips stacked package of claim 1, further comprising an underfill covering the electrically conductive bumps.

7. The multi-chips stacked package of claim 6, wherein the underfill further entirely covers the first active surface of the upper chip.

8. The multi-chips stacked package of claim 6, wherein the underfill further covers a portion of the upper surface of the substrate.

9. The multi-chips stacked package of claim 6, wherein the underfill further covers a portion of the lower surface of the substrate.

10. The multi-chips stacked package of claim 1, further comprising an encapsulation covering the electrically conductive bumps, the first electrically conductive wires, the lower chip and the upper chip.

11. The multi-chips stacked package of claim 1, further comprising an adhesive layer interposed between the first active surface of the upper chip and the second back surface of the lower chip.

12. The multi-chips stacked package of claim 1, further comprising a plurality of solder balls formed on the lower surface of the substrate.

13. The multi-chips stacked package of claim 1, wherein the upper chip covers the opening.

14. The multi-chips stacked package of claim 1, wherein the upper chip is larger than the lower chip in size.

* * * * *